United States Patent
Choi

(10) Patent No.: US 7,676,711 B2
(45) Date of Patent: Mar. 9, 2010

(54) TEST CIRCUIT FOR TESTING COMMAND SIGNAL AT PACKAGE LEVEL IN SEMICONDUCTOR DEVICE

(75) Inventor: Hong-Sok Choi, Kyoungki-do (KR)

(73) Assignee: Hynix Semiconductor, Inc., Gyeonggi-do (KR)

(*) Notice: Subject to any disclaimer, the term of this patent is extended or adjusted under 35 U.S.C. 154(b) by 294 days.

(21) Appl. No.: 11/819,566

(22) Filed: Jun. 28, 2007

(65) Prior Publication Data

US 2008/0082885 A1    Apr. 3, 2008

(30) Foreign Application Priority Data

Sep. 28, 2006    (KR) .................... 10-2006-0095169

(51) Int. Cl.
*G11C 29/00* (2006.01)

(52) U.S. Cl. ...................... 714/723; 714/5; 714/21; 714/25; 714/30; 714/42; 714/45; 714/49; 714/50; 714/51; 714/718; 714/724; 714/726; 714/727; 714/729; 714/732; 714/734; 714/735; 714/742; 365/200; 365/201

(58) Field of Classification Search .................... None
See application file for complete search history.

(56) References Cited

U.S. PATENT DOCUMENTS

| | | | | |
|---|---|---|---|---|
| 4,423,509 | A | * | 12/1983 | Feissel .................. 714/731 |
| 5,012,180 | A | * | 4/1991 | Dalrymple et al. .......... 324/73.1 |
| 5,212,442 | A | | 5/1993 | O'Toole et al. |
| 5,317,711 | A | * | 5/1994 | Bourekas et al. ............. 714/47 |
| 5,418,452 | A | * | 5/1995 | Pyle ...................... 324/158.1 |
| 5,488,688 | A | * | 1/1996 | Gonzales et al. ............. 714/34 |
| 5,530,706 | A | * | 6/1996 | Josephson et al. ........... 714/727 |
| 5,777,489 | A | * | 7/1998 | Barbier et al. ............... 326/40 |
| 6,003,107 | A | * | 12/1999 | Ranson et al. .............. 710/316 |
| 6,282,679 | B1 | | 8/2001 | Lee |
| 6,397,354 | B1 | * | 5/2002 | Ertekin ..................... 714/34 |
| 6,499,123 | B1 | * | 12/2002 | McFarland et al. .......... 714/724 |
| 2003/0235090 | A1 | | 12/2003 | Lee et al. |
| 2004/0113809 | A1 | * | 6/2004 | Harper et al. .......... 340/870.01 |

(Continued)

FOREIGN PATENT DOCUMENTS

JP    11-287774    10/1999

(Continued)

OTHER PUBLICATIONS

Korean Notice of Allowance issued in Korean Patent Application No. 10-2006-0095169 dated Mar. 24, 2008.

*Primary Examiner*—John P Trimmings
(74) *Attorney, Agent, or Firm*—IP & T Law Firm PLC

(57) ABSTRACT

A test circuit for testing a command signal at a package level in a semiconductor device includes: a logic level determining unit for determining logic levels of a plurality of command flag signals in response to a plurality of internal command signals in a test mode; a storage unit for storing the plurality of command flag signals in response to a store control signal and outputting the plurality of command flag signals in series in response to an output control signal; and an output unit for driving an output signal of the storage unit to a data pad.

15 Claims, 3 Drawing Sheets

U.S. PATENT DOCUMENTS

2004/0120190 A1 * 6/2004 Manning ............... 365/189.05
2006/0220257 A1 10/2006 Lee

FOREIGN PATENT DOCUMENTS

| KR | 10-1992-0001079 | | 2/1992 |
| KR | 10-2002-0006992 | | 1/2002 |
| KR | 10-2002-0017278 | * | 3/2002 |
| KR | 10-2002-0045641 | | 6/2002 |
| KR | 10-2003-0050181 | | 6/2003 |

* cited by examiner

TEST CIRCUIT FOR TESTING COMMAND SIGNAL AT PACKAGE LEVEL IN SEMICONDUCTOR DEVICE

CROSS-REFERENCE TO RELATED APPLICATIONS

The present invention claims priority of Korean patent application number 10-2006-95169, filed on Sep. 28, 2006, which is incorporated by reference in its entirety.

BACKGROUND OF THE INVENTION

The present invention relates to a semiconductor device, and more particularly, to a test circuit for testing if an internal command signal is normally generated or not.

The development of semiconductor memory device design and fine processing technology enables Mega integration and multi-function.

However, as line width decreases due to the high integration of the semiconductor memory device, processing fail probability increases during the manufacturing processes, causing further decrease in the yield of semiconductor devices.

FIG. 1 is a diagram of a conventional screening test at a wafer level.

As shown, the conventional screening test is performed to detect dynamic random access memories (DRAMs) where fail occurs at the wafer level.

The screening test detects the fail of the semiconductor memory device by performing a probing test at a wafer level during fabrication of the semiconductor memory devices.

However, when the semiconductor memory device is packaged, there may occur a fail that could not be detected through the probing test at the wafer level. In other words, there may exist a fail that occurs only at a package level of the semiconductor memory device.

Meanwhile, when the semiconductor memory device is packaged, it is impossible to perform the probing test in the same manner as at the wafer level.

For example, when an active command, a write command, and a read command are sequentially inputted from an external circuit after the packaging process, the probing test cannot be performed although there occurs a fail in which data corresponding to the read command is not outputted. Therefore, it is impossible to know whether the fail occurs in the active command or in the write command.

SUMMARY OF THE INVENTION

It is, therefore, an object of the present invention to provide a test circuit for testing if an internal command is normally generated in response to an external command at a package level in a semiconductor device.

In accordance with an aspect of the present invention, there is provided a test circuit for testing a command signal at a package level in a semiconductor device which includes a logic level determining unit for determining logic levels of a plurality of command flag signals in response to a plurality of internal command signals in a test mode; a storage unit for storing the plurality of command flag signals in response to a store control signal and outputting the plurality of command flag signals in series in response to an output control signal; and an output unit for driving an output signal of the storage unit to a data pad.

In accordance with another aspect of the present invention, there is provided a test circuit for testing a command signal at a package level in a semiconductor device which includes a logic level determining unit for determining a logic level of a command flag signal in response to an internal command signal in a test mode; and an output unit for driving the command flag signal to a data pad.

DESCRIPTION OF SPECIFIC EMBODIMENTS

Hereinafter, a test circuit for testing a command signal at a package level in a semiconductor device in accordance with exemplary embodiments of the present invention will be described in detail with reference to the accompanying drawings.

Figure 1:
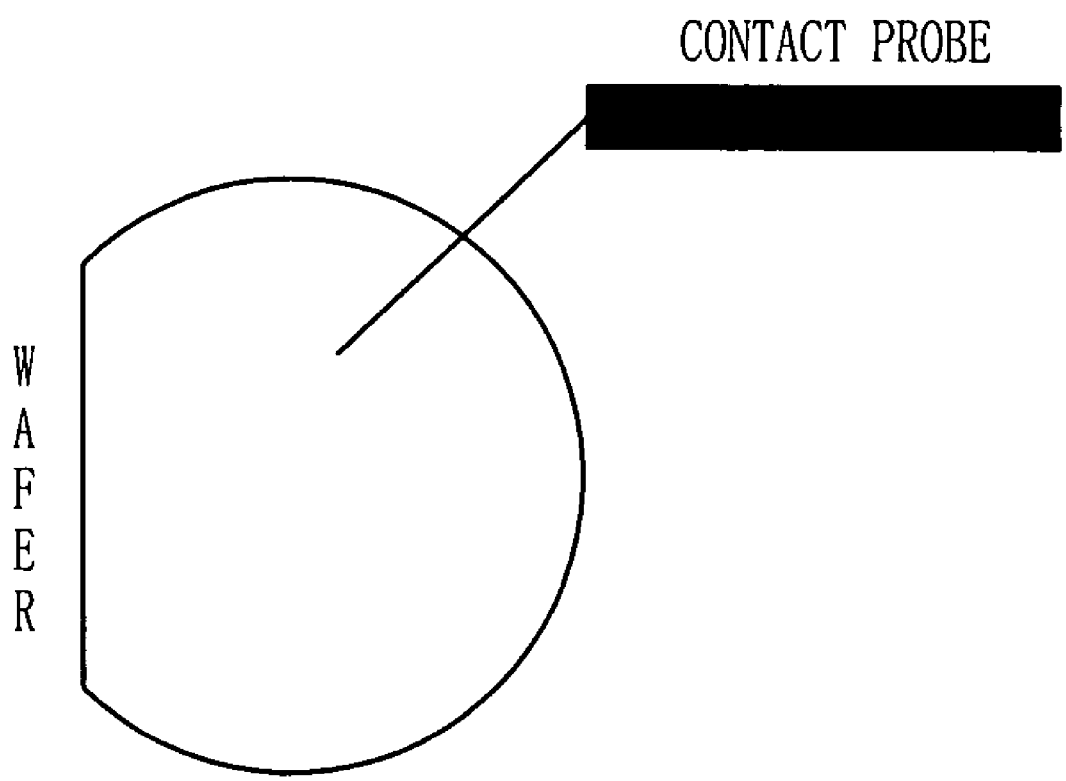
FIG. 1 is a diagram of a conventional screening test at a wafer level.
Figure 2:
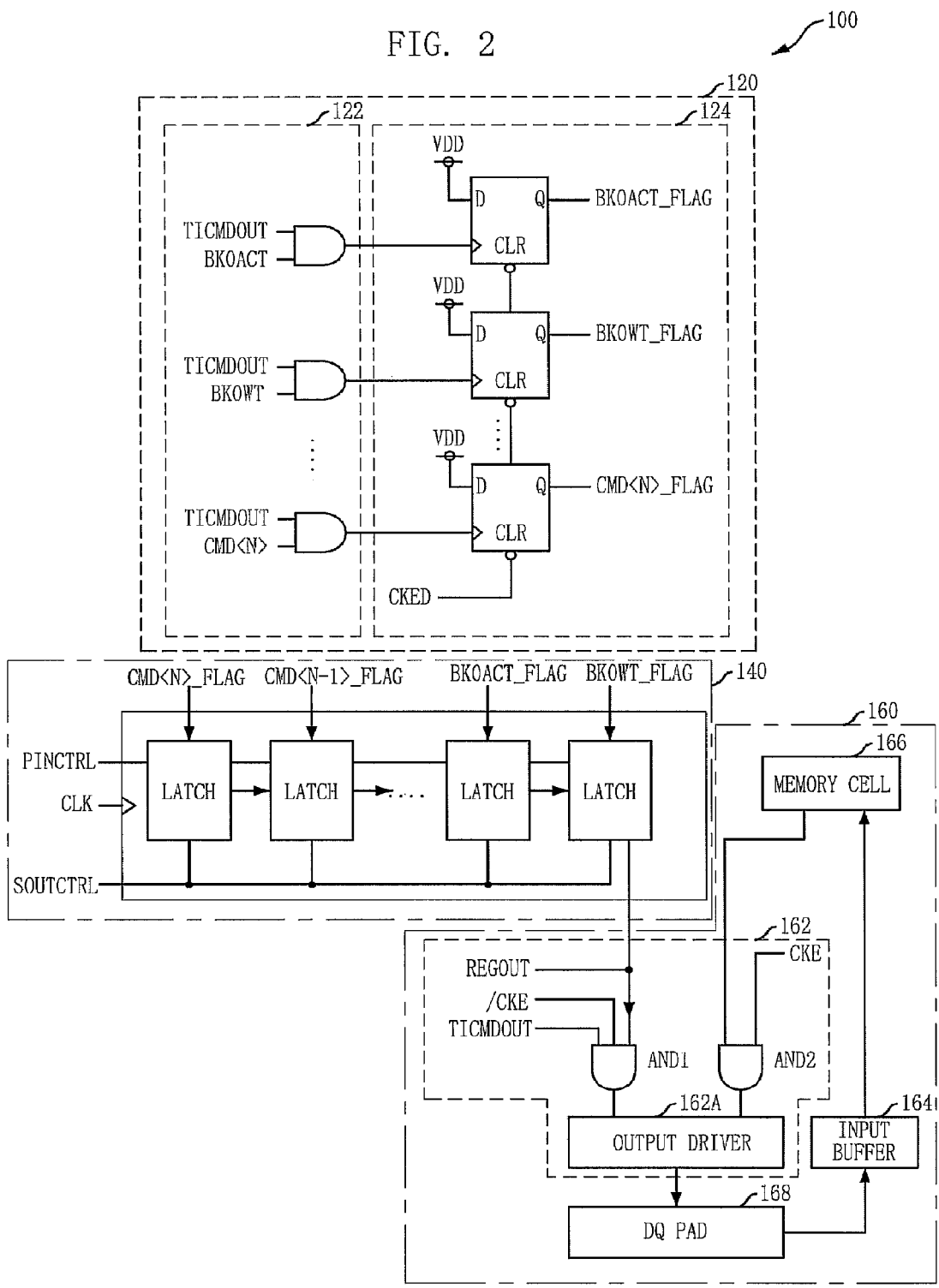
FIG. 2 is a circuit diagram of a test circuit for testing a command signal at a package level in a semiconductor device in accordance with an embodiment of the present invention.

FIG. 2 is a circuit diagram of a test circuit for testing a command signal at a package level in a semiconductor device in accordance with an embodiment of the present invention.

As shown, a test circuit 100 includes a logic level determining unit 120, a storage unit 140, and an output unit 160.

The logic level determining unit 120 determines logic levels of a plurality of command flag signals. For example, as depicted in FIG. 2, the logic levels of command flag signals BK0ACT_FLAG, BK0WT_FLAG, CMD<0:N>_FLAG, N being a positive integer, may be determined in response to a plurality of internal command signals BK0ACT, BK0WT, CMD<0:N> in a test mode. As used herein, CMD<0:N> is used to refer generally to additional command flags. The storage unit 140 stores the plurality of command flag signals in response to a store control signal PINCTRL and outputs them in series in response to an output control signal SOUTCTRL. The output unit 160 drives an output signal REGOUT of the storage unit 140 to a data output (DQ) pad 168.

The logic level determining unit 120 detects the toggling of the internal command signals and determines the logic levels of the command flag signals according to the detection result.

In detail, the logic level determining unit 120 includes a plurality of AND gates 122 and a plurality of D flip-flops 124.

Each of the AND gates 122 is configured to receive a test mode operation signal TICMDOUT and a corresponding one of the internal command signals, respectively. The D flip-flops 124 are respectively connected to the AND gates 122 and are initialized in response to a delayed clock enable signal CKED generated by delaying a clock enable signal CKE by a predetermined time. In addition, the D flip-flops 124 are configured to receive the output signals of the AND gates 122 as a clock input and an external voltage VDD as a data input and determine the logic levels of the command flag signals, respectively. The D flip-flops 124 connected to the AND gates 122 change the logic levels of the command flag signals from a logic low level to a logic high level when the output signals of the AND gates 122 are toggled.

The storage unit 140 has two input/output schemes, that is, a parallel-serial scheme and a serial-serial scheme. According to the parallel-serial scheme, the storage unit 140 receives and stores the command flag signals in parallel and outputs them in series. According to the serial-serial scheme, the storage unit 140 receives and stores the command flag signals in series and outputs them in series.

The parallel-serial scheme can output the command flag signals in a predetermined order. That is, the user can determine the data output order.

On the other hand, the serial-serial scheme outputs the command flag signals in the input order. That is, the command flag signal inputted first is outputted first (i.e., First In First Out).

In the parallel-serial scheme, storage unit 140 acts as a parallel-serial register for storing the command flag signals in parallel in response to the store control signal PINCTRL and outputting them in series in response to the output control signal SOUTCTRL. In this scheme, a plurality of latches, as depicted in FIG. 2, receive the command flag signals, respectively.

In the serial-serial scheme, storage unit 140 acts as a serial-serial register for storing the command flag signals in series and outputting them in series in response to the output control signal PINCTRL. Again, a plurality of latches as shown in FIG. 2 store the command flag signals, respectively.

Further, the output unit 160 includes an output driving unit 162 and an input buffer 164. The output driving unit 162 drives data of a memory cell 166 to the DQ pad 168 in response to the clock enable signal CKE, and drives the output signal REGOUT of the storage unit 140 to the DQ pad 168 in response to an inverted clock enable signal /CKE having an inverted phase with respect to the clock enable signal CKE. The input buffer 164 buffers data inputted through the DQ pad to transfer the buffered data to the memory cell 166.

In detail, the output driving unit includes first and second AND gates AND1 and AND2, and an output driver 162A. The first AND gate AND1 is configured to receive the output signal REGOUT of the storage unit 140, the inverted clock enable signal /CKE, and the test mode operation signal TICMDOUT. The second AND gate AND2 is configured to receive the data of the memory cell 166 and the clock enable signal CKE. The output driver 162A is configured to drive output signals of the first and second AND gates AND1 and AND2 to the DQ pad 168.

An operation of the test circuit will be described below with reference to FIG. 3.

Figure 3:
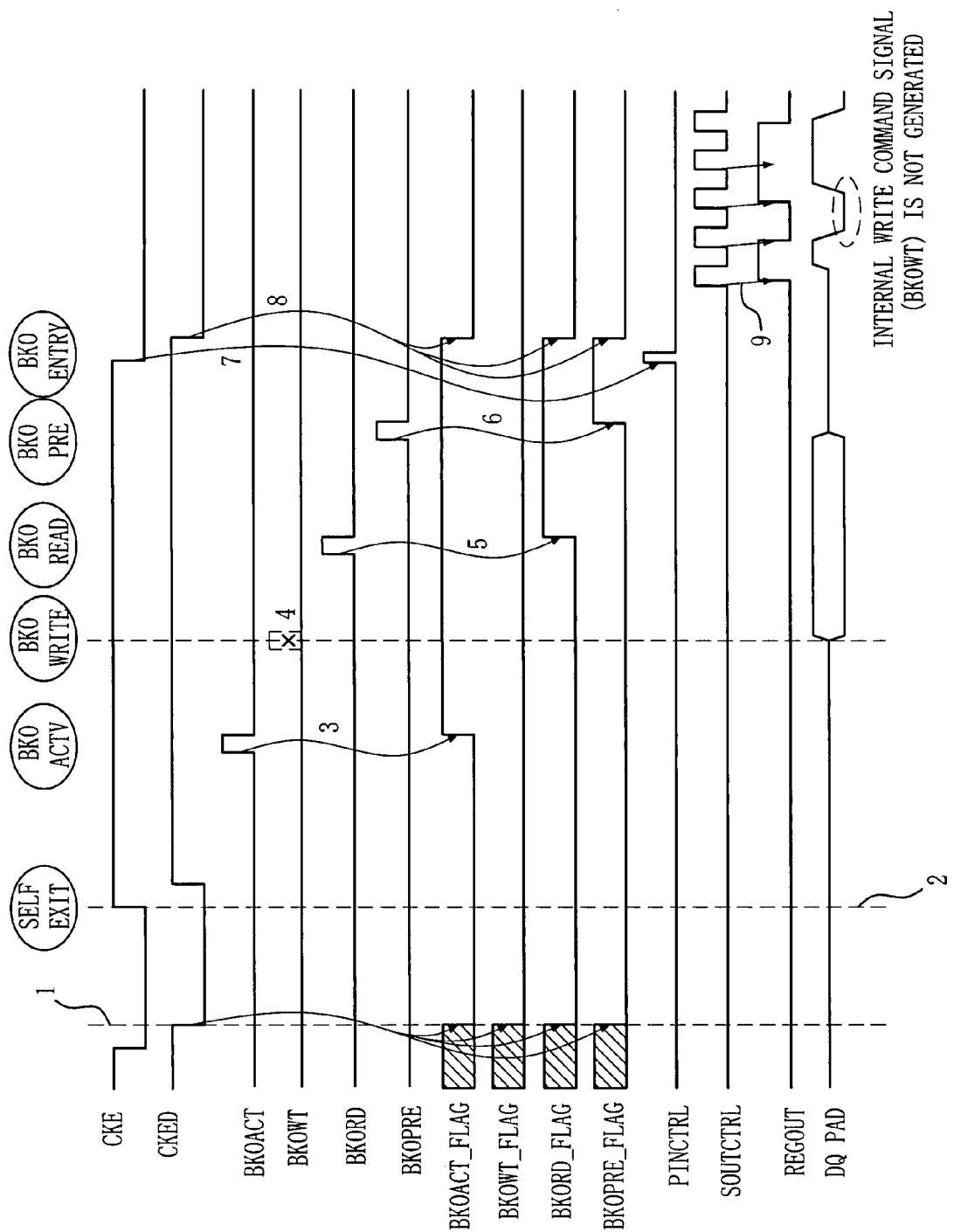
FIG. 3 is a timing diagram of the test circuit illustrated in FIG. 2.

FIG. 3 is a timing diagram of the test circuit illustrated in FIG. 2.

First, the command flag signals (i.e., command flag signals BK0ACT_FLAG, BK0WT_FLAG, BK0RD_FLAG, BK0PRE_FLAG . . . , CMD<0:N>_FLAG) are initialized in response to a falling edge of the delayed clock enable signal CKED generated by delaying the clock enable signal CKE by a predetermined time, as indicated by a reference numeral '1'. That is, the command flag signals are initialized in a self refresh mode.

Second, after the self refresh mode is exited as indicated by a reference numeral '2', the active command signal BK0 ACTV, the write command signal BK0 WRITE, the read command signal BK0 READ, and the precharge command signal BK0 PRE are inputted in sequence.

Third, the internal command signals BK0ACT, BK0RD and BK0PRE, are toggled in response to the inputted command signals, respectively. That is, the internal command signals BK0ACT, BK0RD and BK0PRE are toggled in response to the active command signal BK0 ACTV, the read command signal BK0 READ, and the precharge command signal BK0 PRE, respectively. However, in this time, the internal write command signal BK0WT corresponding to the write command signal BK0 WRITE is not toggled due to a package-level fail.

Fourth, the logic levels of the command flag signals BK0ACT_FLAG, BK0RD_FLAG, and BK0PRE_FLAG change from a logic low level to a logic high level in response to the toggling of the internal command signals BK0ACT, BK0RD and BK0PRE, respectively, as indicated by a reference numeral '3', '5' and '6'. That is, the logic levels of the active command flag signal BK0ACT_FLAG, the read command flag signal BK0RD_FLAG, and the precharge command flag signal BK0PRE_FLAG change from a logic low level to a logic high level in response to the internal active command signal BK0ACT, the internal read command signal BK0RD, and the internal precharge command signal BK0PRE, respectively. However, the write command flag signal BK0WT_FLAG maintains a logic LOW state because the internal write command signal BK0WT is not toggled as indicated by a reference numeral '4'.

Fifth, the store control signal PINCTRL is toggled in response to the falling edge of the clock enable signal CKE, and the command flag signals are stored in the register in response to the toggled store control signal PINCTRL.

In case where the register is the parallel-serial register, the store control signal PINCTRL is toggled only one time as illustrated in FIG. 3. On the other hand, in case where the register is the serial-serial register, the store control signal PINCTRL is toggled several times in synchronization with an external clock signal (not shown).

Sixth, the command flag signals are initialized in response to the falling edge of the delayed clock enable signal CKED, as indicated by a reference numeral '8'.

Seventh, the output control signal SOUTCTRL begins to be toggled in response to the toggling of a next clock signal after the clock enable signal CKE changes to a logic low level. The output control signal SOUTCTRL is toggled in synchronization with the external clock signal.

Eighth, the register outputs the stored signal to the DQ pad in response to the toggling of the output control signal SOUTCTRL, as indicated by a reference numeral '9'. At this point, the non-toggling of the internal write command signal BK0WT corresponding to the write command BK0 WRITE can be detected through the DQ pad in the outside.

The test circuit of FIG. 2 generates the command flag signals. Therefore, the test circuit requires the storage unit 140 for storing the command flag signals.

However, a circuit that generates only one command flag signal may include a logic level determining unit for determining the logic level of the command flag signal in response to the internal command signal in the test mode, and an output unit for driving the command flag signal to the DQ pad.

In addition, the test circuit may include only one latch that can store one command flag signal, instead of the parallel-serial register and the serial-serial register including a plurality of latches.

As described above, even when the probing test cannot be performed on the internal command signal at the package level, the operation fail at the package level and package environment can be detected by outputting the signal indicating the generation of the internal command signal through the DQ pad.

While the present invention has been described with respect to certain preferred embodiments, it will be apparent to those skilled in the art that various changes and modifications may be made without departing from the spirit and scope of the invention as defined in the following claims.

What is claimed is:

1. A test circuit for testing a command signal at a package level in a semiconductor device, the test circuit comprising:
   a logic level determining unit for determining logic levels of a plurality of command flag signals in response to a plurality of internal command signals in a test mode;
   a storage unit for storing the plurality of command flag signals in response to a store control signal and outputting the plurality of command flag signals in series in response to an output control signal; and
   an output unit for driving an output signal of the storage unit to a data pad.

2. The test circuit as recited in claim 1, wherein the logic level determining unit detects an occurrence of each internal command signal and determines the logic levels of the command flag signals according to the detection result.

3. The test circuit as recited in claim 1, wherein the logic level determining unit includes:
   a plurality of AND gates, each AND gate configured to receive a test mode operation signal and a corresponding one of the internal command signals; and
   a plurality of D flip-flops, each D flip-flop connected to an output terminal of a corresponding one of the AND gates and initialized in response to a delayed clock enable signal generated by delaying a clock enable signal by a predetermined time,
   a plurality of D flip-flops, each D flip-flop connected to an output terminal of a corresponding one of the AND gates and initialized in response to a delayed clock enable signal generated by delaying a clock enable signal by a predetermined time,
   wherein the D flip-flops are configured to receive output signals of the AND gates as a clock input and an external voltage as a data input and determine the logic levels of the command flag signals.

4. The test circuit as recited in claim 1, wherein the storage unit includes a parallel-serial register for storing the command flag signals in parallel in response to the store control signal and outputting the stored command flag signals in series in a predetermined order in response to the output control signal.

5. The test circuit as recited in claim 4, wherein the parallel-serial register includes a plurality of latches, each latch for receiving a corresponding one of the command flag signals and storing the corresponding command flag signal.

6. The test circuit as recited in claim 4, wherein the parallel-serial register stores the command flag signals in parallel in response to the store control signal being toggled at a falling edge of a clock enable signal.

7. The test circuit as recited in claim 4, wherein the parallel-serial register outputs the command flag signals in series in a predetermined order in response to a rising edge of the output control signal being toggled in synchronization with a clock signal.

8. The test circuit as recited in claim 1, wherein the output unit includes:
   an output driving unit for driving data of a memory cell to the data pad in response to a clock enable signal, driving the output signal of the storage unit to the data pad in response to an inverted clock enable signal having an inverted phase with respect to the clock enable signal; and
   an input buffer for buffering data inputted through the data pad to transfer the buffered data to the memory cell.

9. The test circuit as recited in claim 8, wherein the output driving unit includes:
   a first AND gate configured to receive the output signal of the storage unit, the inverted clock enable signal, and a test mode operation signal;
   a second AND gate configured to receive the data of the memory cell and the clock enable signal; and
   an output driver configured to drive output signals of the first and second AND gates to the data pad.

10. A test circuit for testing a command signal at a package level in a semiconductor device, comprising:
    a logic level determining unit for determining a logic level of a command flag signal in response to an internal command signal in a test mode to provide the command flag signal; and
    an output unit to receive the command flag signal for driving the command flag signal to a data pad.

11. The test circuit as recited in claim 10, further comprising a storage unit for storing the command flag signal from the logic level determining unit in response to a store control signal and outputting the stored command flag signal to the output unit as the command flag signal in response to an output control signal.

12. The test circuit as recited in claim 10, wherein the logic level determining unit detects an occurrence of the internal command signal and determines the logic level of the command flag signal according to the detection result.

13. The test circuit as recited in claim 10, wherein the logic level determining unit includes:
    an AND gate configured to receive a test mode operation signal and the internal command signal; and
    a D flip-flop configured to be initialized in response to a delayed clock enable signal generated by delaying a clock enable signal by a predetermined time and to receive an output signal of the AND gate as a clock input and an external voltage as a data input and determine the logic level of the command flag signal.

14. The test circuit as recited in claim 10, wherein the output unit includes:
    an output driving unit for driving data of a memory cell to the data pad in response to a clock enable signal; and
    an input buffer for buffering data inputted through the data pad to transfer the buffered data to the memory cell.

15. The test circuit as recited in claim 14, wherein the output driving unit includes:
    a first AND gate configured to receive the command flag signal, the inverted clock enable signal, and a test mode operation signal;
    a second AND gate configured to receive the data of the memory cell and the clock enable signal; and
    an output driver configured to drive output signals of the first and second AND gates to the data pad.

* * * * *